United States Patent [19]

Morita et al.

[11] Patent Number: 4,780,606
[45] Date of Patent: * Oct. 25, 1988

[54] PROJECTION ALIGNER METHOD UTILIZING MONITORING OF LIGHT QUANTITY

[75] Inventors: Koyo Morita, Higashimurayama; Keizo Nomura, Higashiyamato; Hiroshi Nishizuka, Higashikurume; Tai Hoshi, Koganei; Yoichiro Tamiya, Higashimurayama; Terushige Asakawa, Koganei, all of Japan

[73] Assignees: Hitachi, Ltd; Hitachi Ome Electronic Co., Inc., both of Tokyo, Japan

[ * ] Notice: The portion of the term of this patent subsequent to Oct. 22, 2004 has been disclaimed.

[21] Appl. No.: 100,227

[22] Filed: Sep. 23, 1987

Related U.S. Application Data

[60] Division of Ser. No. 823,750, Jan. 28, 1986, Pat. No. 4,701,608, which is a continuation of Ser. No. 519,675, Aug. 2, 1983, Pat. No. 4,598,197.

[30] Foreign Application Priority Data

Aug. 9, 1983 [JP] Japan ................... 57-137269

[51] Int. Cl.$^4$ ............... G01J 1/32; G01J 1/42; G05D 25/00
[52] U.S. Cl. ................... 250/205; 356/222
[58] Field of Search ............ 250/205, 548, 557; 356/399–401, 121, 218, 222; 378/34

[56] References Cited

U.S. PATENT DOCUMENTS 4,598,197 7/1986 Morita et al. .......... 250/205
4,701,608 10/1987 Morita et al. .......... 250/205

Primary Examiner—Edward P. Westin
Assistant Examiner—Charles F. Wieland
Attorney, Agent, or Firm—Antonelli, Terry & Wands

[57] ABSTRACT

A projection aligner wherein light from a light source is passed through a mask so as to focus an image of a pattern of the mask on a wafer, characterized in that at least one sensor for monitoring a luminosity and a distribution thereof is disposed in an optical path between the light source and the mask, whereby a luminosity and a distribution thereof on the wafer can be controlled to proper values. The projection aligner is effective for application to minute processing technologies for the production of semiconductor devices, etc.

29 Claims, 5 Drawing Sheets

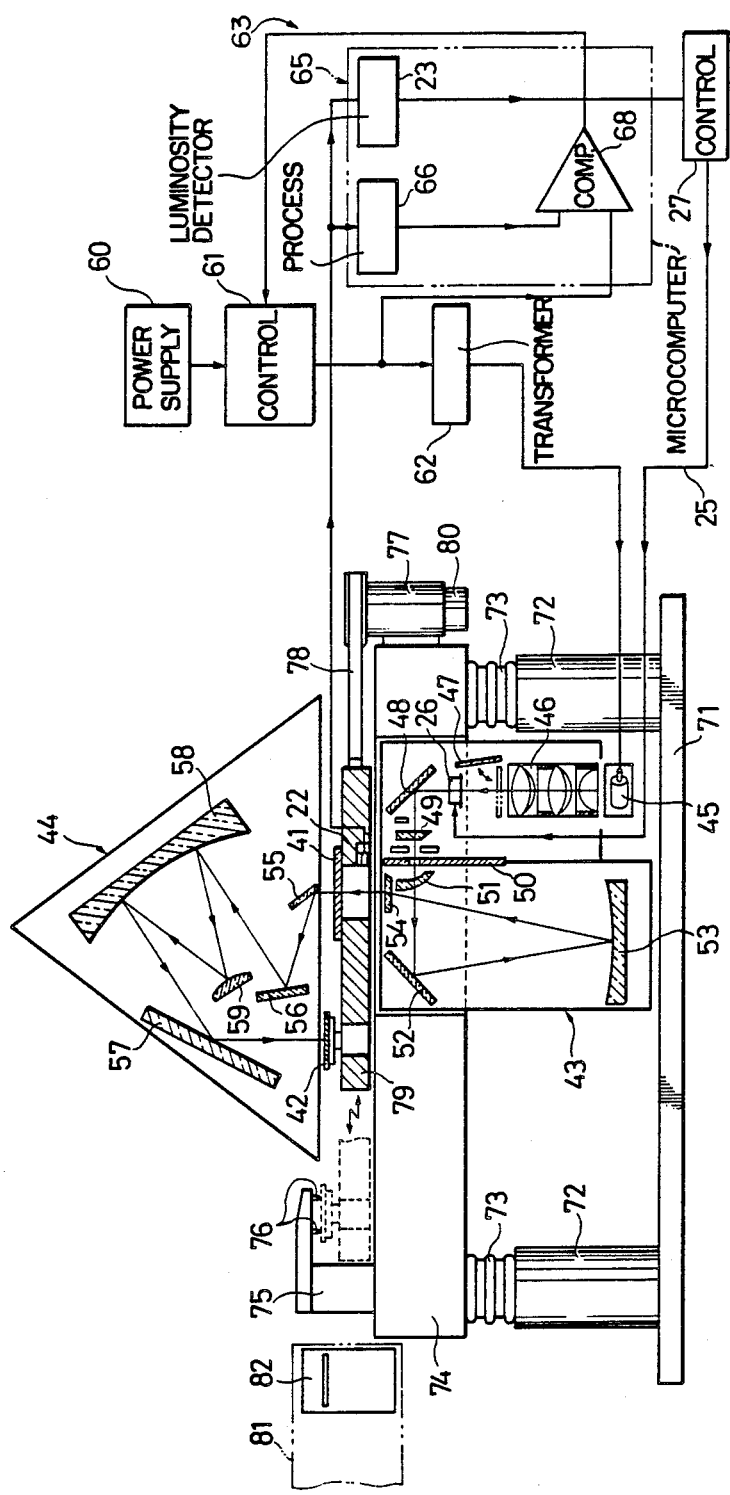

PROJECTION ALIGNER METHOD UTILIZING MONITORING OF LIGHT QUANTITY

This is a divisional application of Ser. No. 823,750, filed Jan. 29, 1986, now U.S. Pat. No. 4,701,608 which is a continuation of Ser. No. 519,675, filed Aug. 2, 1983, now U.S. Pat. No. 4,598,197.

BACKGROUND OF THE INVENTION

The present invention relates to a projection aligner, and more particularly to a novel projection aligner which can control a luminosity (or intensity) and the distribution (or uniformity) thereof.

In forming an integrated circuit on a semiconductor wafer, the so-called photolithographic process is performed. In this process, a projection aligner is utilized as an apparatus for printing the pattern of a photo-mask on the surface of the wafer. Since the projection aligner focuses the pattern of the photo-mask on the wafer surface and exposes a photoresist film on the wafer surface to light by the use of an optical system, it has the advantage of versatile printing when compared with a contact type apparatus which holds a photo-mask and a wafer in close contact and then executes exposure to light. On the other hand, however, the projection type is disadvantageous in that nonuniformity in the luminosity of the illuminating light and nonuniformity in the distribution of the luminosity are prone to directly affect the pattern image on the wafer. To the end of forming a pattern image of proper luminosity and uniform luminosity distribution, accordingly, it is required to strictly control the luminosity of the illuminating light and the distribution thereof.

To this end, heretofore, it has merely been conducted as one of the operations of the photolithographic process that an operator measures the luminosities at the positions of the projection aligner near the wafer and adjusts the various parts of the aligner on the basis of the measured results so as to make the luminosities uniform. Therefore, even when the luminosity or the luminosity distribution has deviated in the course of the operation or during any other preparatory operation, it is difficult to find out the deviation. Ultimately, the photoresist film is exposed to light of improper luminosity or luminosity distribution, and the exposed dimensions do not fall within ratings, resulting in the problem that a nonconforming article arises to worsen the available percentage.

On the other hand, in the pattern exposure of the photolithographic process, in order to achieve good printing by the use of a projection aligner which focuses a mask pattern image on a wafer through a projecting optical system, a luminosity on the wafer needs to be held stable. To this end, it is considered to furnish the projection aligner with a luminosity control device. The luminosity control device should ideally be so constructed that light actually projected on the wafer surface is detected by a sensor and that the quantity of light of a lamp or the like is controlled by feedback on the basis of a result obtained by comparing the detected value with a reference value. In actuality, however, the construction is difficult for such a reason that the mask pattern shades the sensor. It is accordingly the real situation that the sensor is inevitably installed in another place within the optical system.

It is therefore considered to arrange the sensor near the lamp or near the reflector of an illuminating optical system. Such position, however, is a position on an upper stream side (on a side closer to the lamp which is a light source for exposure) when viewed from the entire optical system. It is impossible to precisely grasp the quantity of the actual light which reaches the wafer after starting from here and passing through a large number of further optical elements.

Meanwhile, in order to feedback-control the quantity of light of the lamp, the light quantity of the lamp needs to be precisely detected. It can accordingly be proposed to dispose also a sensor for light adjustment, called a "monitor under the lamp", at a position near the lamp and to send the output of the sensor to the aforementioned comparing system for the feedback control of the light quantity of the lamp. The light adjusting sensor, however, involves the problems that a complicated structure is necessary for eliminating the influences of lamp heat etc. and that an attendant amplifier is necessitated to increase the cost.

SUMMARY OF THE INVENTION

It is accordingly an object of the present invention to provide a projection aligner which can promptly detect deviations in a luminosity and the distribution thereof so as to prevent a nonconforming article from arising.

Another object of the present invention is to provide a projection aligner which can promptly detect deviations in a luminosity and the distribution thereof and which can compensate the improper luminosity and the nonuniform luminosity distribution immediately and automatically.

Still another object of the present invention is to provide a projection aligner which detects a luminosity and the distribution thereof closest to those of a wafer being a material to-be-processed and controls the quantity of light of a lamp being a light source on the basis of them, whereby the luminosity and the distribution thereof on the wafer are stabilized to realize wafer fabrication permitting the formation of a semiconductor device of high quality, and the apparatus can be rendered simple in structure and low in cost.

In order to accomplish the objects, the present invention comprises a luminosity sensor which is advanced into an exposure light path and retreated out of it with the exposure operation of a projection aligner, means for detecting a luminosity and a distribution thereof on the basis of an output of the luminosity sensor, and alarm means for issuing an alarm on the basis of an output of the detection means when the luminosity or the distribution thereof has deviated, the alarm means being capable of stopping the exposure.

Besides the luminosity sensor and detection means mentioned above, the present invention comprises means for automatically compensating the luminosity distribution when it has deviated.

This invention can best be understood by reference to the following description taken in connection with the accompanying illustrative drawings.

BRIEF DESCRIPTION OF THE DRAWINGS

FIG. 6 is a front view showing a projection aligner which is still another embodiment of the present invention.

DESCRIPTION OF THE PREFERRED EMBODIMENTS

Now, the present invention will be described in conjunction with illustrated embodiments.

Figure 1:
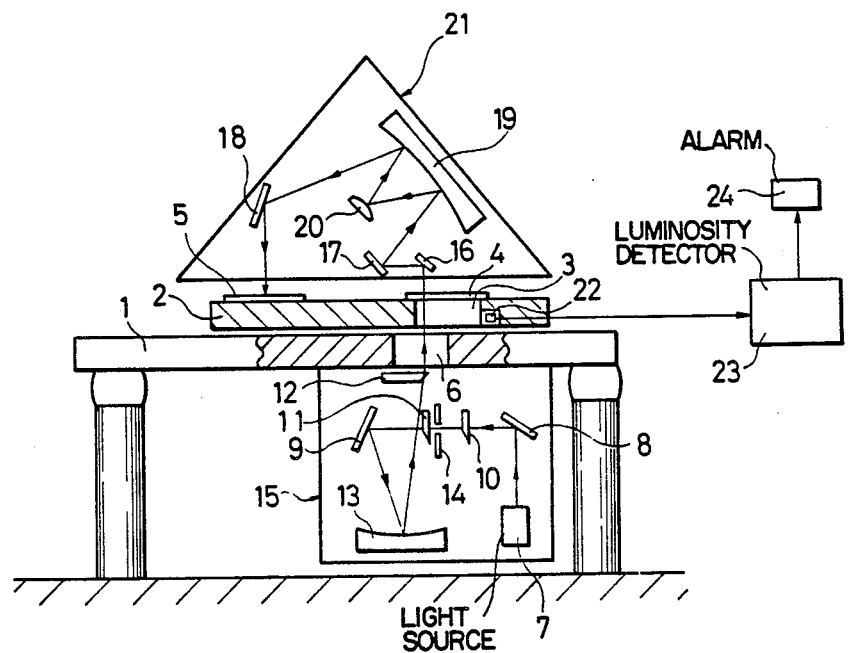
FIG. 1 is a front view showing a projection aligner which is an embodiment of the present invention.

FIG. 1 is a setup diagram of an embodiment of a projection aligner according to the present invention, and particularly exemplifies a 1:1 projection aligner. Referring to the figure, numeral 2 designates a scan table which is reciprocated rightwards and leftwards, as viewed in the figure, on a bed 1 by an air bearing mechanism. A photo-mask 4 formed with a predetermined pattern is set on a through hole 3 which is provided on one end side of the scan table, while a semiconductor wafer 5 whose surface is coated with a photoresist is set on the other end side. The bed 1 has a through hole 6 in a part on one end side thereof. Under this hole 6, an illumination unit 15 is disposed which has a light source lamp 7, reflectors 8, 9, lenses 10, 11, 12, a concave mirror 13 and a slit member 14. The illumination unit 15 passes the light of the light source lamp 7 through the lenses and the slit via the reflectors and further passes the light through the hole 6, whereupon it can illuminate the photo-mask in a light shape extending along the arcuate slit of the slit member 14. On the other hand, a focusing unit 21 which has reflectors 16, 17, 18, a concave mirror 19 and a convex mirror 20 is disposed above the through hole 6, and it projects and focuses the image of the photo-mask 4 on the surface of the wafer 5.

Figure 2:
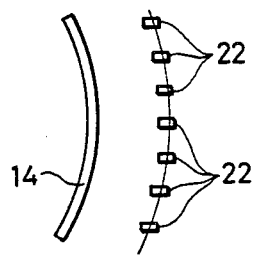
FIG. 2 is an explanatory view showing the arrangement of luminosity sensors.

Further, in the through hole 3 of the scan table 2, a plurality of luminosity sensors 22 are disposed and fixed arcuately so as to conform to the shape of the slit as FIG. 2 shows the plan state thereof. The luminosity sensors 22 are connected to luminosity detection means 23 which is principally composed of a microcomputer, and in which the output values of the respective luminosity sensors 22 are compared with one another and with a predetermined reference value. An alarm unit 24 is connected to the luminosity detection means 23, and it is actuated by a predetermined output signal from the latter.

According to the above construction, the arcuate slit light formed in the illumination unit 15 illuminates the photo-mask 4 arcuately through the holes 6 and 3. The illuminated part of the photo-mask is focused on the surface of the wafer 5 by the focusing unit 21. Accordingly, when the scan table 2 is moved, for example, leftwards as viewed in the figure, the slit light scans the whole surface of the photo-mask 4, with the result that the wafer surface is exposed to the light for the whole surface of the photo-mask. At this time, when the scan table 2 is moved a distance which is somewhat greater than the dimension of the photo-mask 4, the slit light impinges on the plurality of luminosity sensors 22 disposed in close proximity to the photo-mask 4, and the luminosities of the corresponding parts of the slit light are provided from the respective luminosity sensors 22. Accordingly, the luminosity detection means 23 detects the luminosity of the slit light and the distribution thereof on the basis of the luminosity outputs. When the luminosity and the distribution thereof deviate from predetermined references, the luminosity detection means actuates the alarm unit 24, and the operation of the projection aligner is stopped by an operator or automatically.

Thus, with this projection aligner, the luminosity and the distribution thereof are checked at each reciprocation of the scan table 2, namely, at each exposure of the photo-mask 4, and the exposure is immediately stopped in the presence of the deviations of the luminosity and the distribution thereof, so that a nonconforming article caused by nonuniformity in the exposure luminosity can be reliably prevented, and enhancement in the available percentage can be achieved. Moreover, the projection aligner dispenses with the luminosity check and luminosity distribution check to be performed in a preparatory operation once a day and can shorten the period of time of the preparatory operation.

Instead of disposing the plurality of luminosity sensors 22, it is allowed to move a single luminosity sensor arcuately along the slit light and to measure luminosities at the respective points of the movement.

Figure 3:
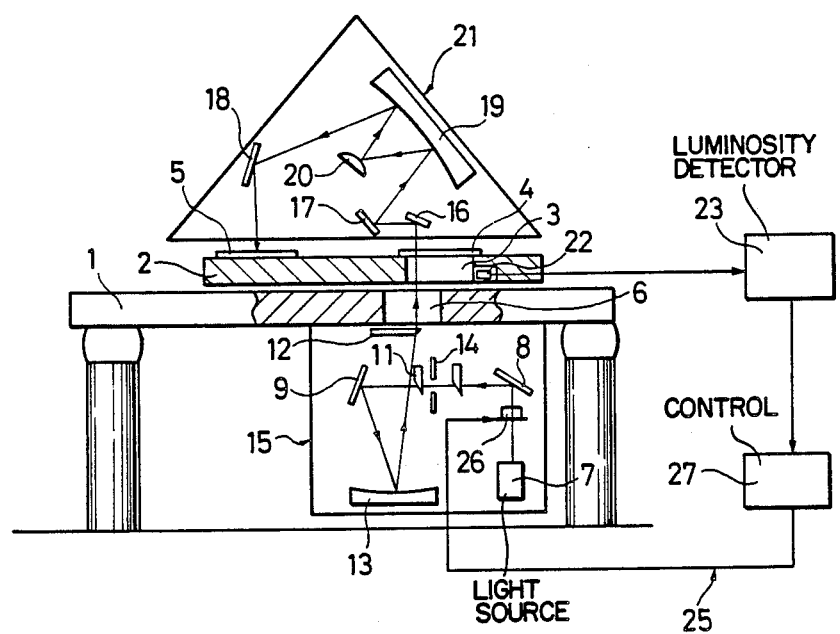
FIG. 3 is a front view showing a projection aligner which is an embodiment of the present invention.

FIG. 3 shows a different embodiment of the projection aligner according to the present invention. The same parts in the figure as in FIG. 1 are assigned the same symbols, and will not be repeatedly explained.

The present embodiment is characterized by comprising compensation means 25 for automatically compensating the luminosity and the distribution thereof on the basis of their outputs from the detection means 23. Referring to the figure, light shield devices 26 are disposed within the illumination unit 15, and they are driven by a control unit 27 which operates on the basis of the outputs of the luminosity detection means 23, whereby the luminosity and the distribution thereof can be compensated.

Figure 4:
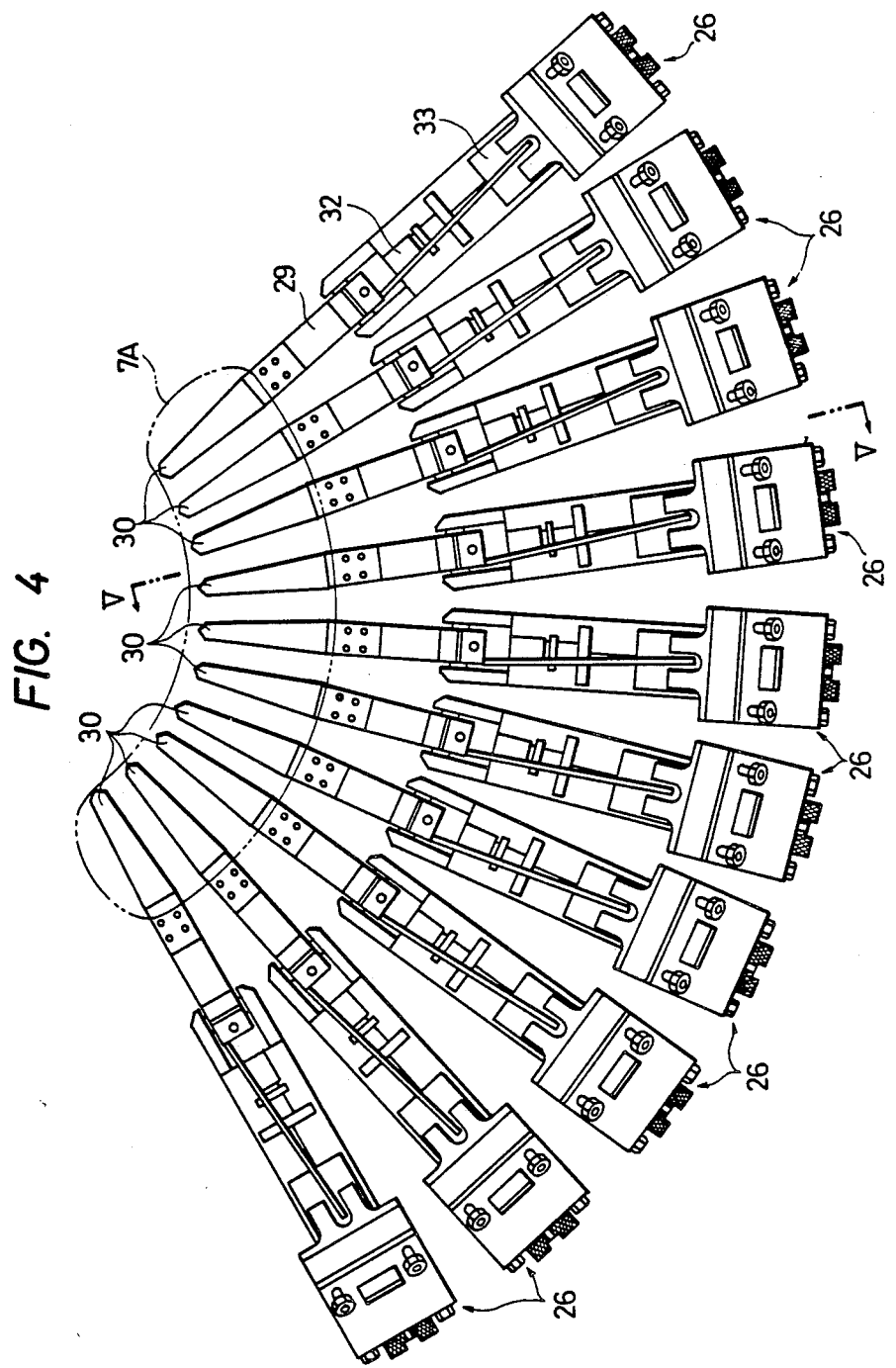
FIG. 4 is a front view of light shield devices.
Figure 5:
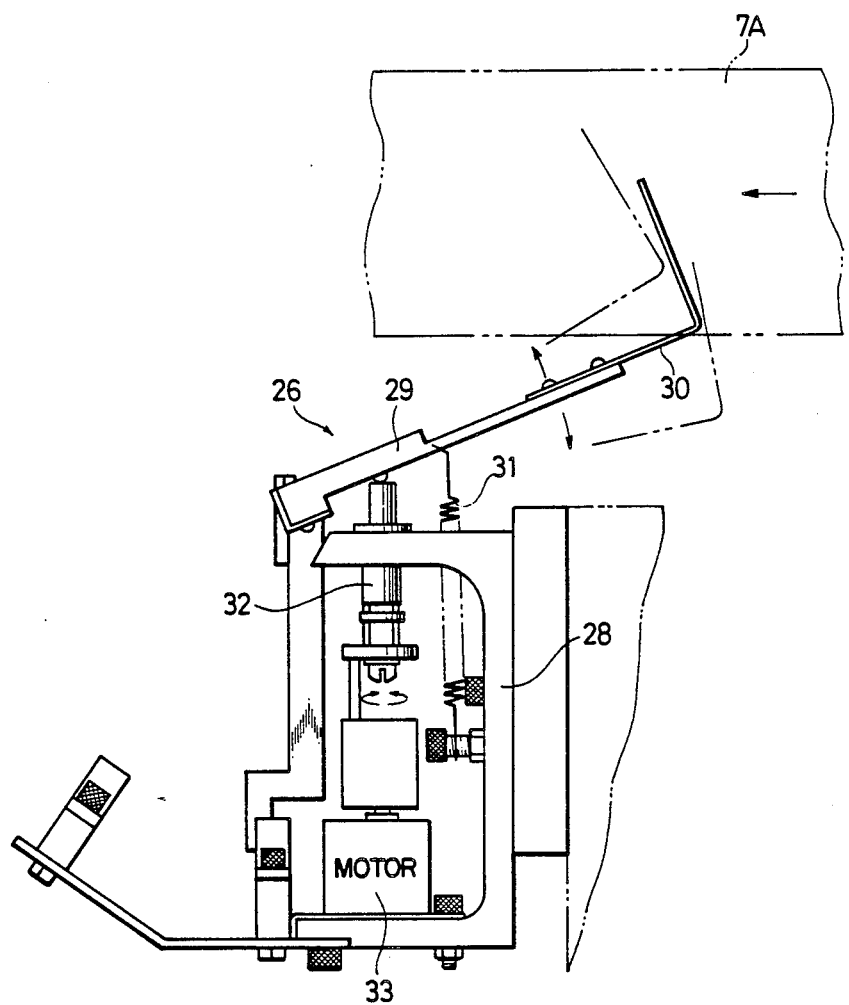
FIG. 5 is a side view of the light shield device taken along line V—V in FIG. 4.

As shown in FIGS. 4 and 5, the plurality of light shield devices 26 are juxtaposed along the arcuate light beam 7A of the light source lamp 7, and the respective devices are driven independently of one another. Each of the devices has a rocking arm 29 one end of which is supported at the upper end of a frame 28, and the other end of which has a substantially L-shaped light shield plate 30 fixed thereto. The arm 29 is urged downwards by a tension spring 31, while the fore end of a micrometer head 32 supported by the frame 28 abuts on the lower surface of the arm. The micrometer head 32 is coupled to a pulse motor 33 mounted on the lower side of the frame 28, so as to be rotated by the motor, and has its fore end moved up or down in accordance with the rotational direction of the motor. This pulse motor 33 is driven to rotate forwards or reversely by a signal from the control unit 27 which is connected to the luminosity detection means 23.

According to the above construction, when the luminosity detection means 23 has detected nonuniformity in the luminosity on the basis of the outputs of the luminosity sensors 22, it informs the control unit 27 of a higher luminosity part or lower luminosity part in the slit light. In response thereto, the control unit 27 selectively drives the light shield device 26 which corresponds to the slit light part requiring the compensation. More specifically, the light shield device at the higher luminosity part rotates the micrometer head 32 rightwards by means of the pulse motor 33, thereby to move up the fore end of the micrometer head and to rock the arm 29 upwards. Thus, the light shield plate 30 unitary with the arm 29 increases in the amount of advance into the light beam 7A, to reduce the quantity of light of the corresponding part and to partially lower the luminosity. On the other hand, regarding the lower luminosity part, by rotating the pulse motor 33 leftwards, the light shield plate 30 is moved down and the amount of advance thereof into the light beam 7A is reduced, to increase the quantity of light of the corresponding part and to partially raise the luminosity. Accordingly, a uniform luminosity is automatically attained by controlling the respective light shield devices independently of one another.

Here, the light shield device may well be replaced with another construction, and it is only required that the amount of advance of the light shield plate into the light beam can be partially adjusted. In addition, as the compensation means, the apparatus may well be put into a structure capable of varying the position of the light source lamp, instead of being furnished with the light shield devices, so as to render the luminosity distribution uniform by adjusting the position of the lamp.

As set forth above, according to the projection aligner of the present invention, at least one luminosity sensor to be inserted and located in an optical path at each exposure of a photo-mask is disposed for detecting a luminosity and the distribution thereof, and when the distribution has become nonuniform, the nonuniformity is automatically compensated. Therefore, the luminosity and the distribution thereof are always held proper and uniform, and a nonconforming article attributed to the improper luminosity or the nonuniform luminosity is prevented from arising. This brings forth the effect that enhancement in the available percentage can be achieved.

FIG. 6 is a general setup diagram of a projection aligner which is another embodiment of the present invention. Numeral 41 designates a mask which is formed with a predetermined pattern, and numeral 42 a wafer on which the mask pattern is printed through exposure to light. The mask 41 is illuminated by an illuminating optical system 43, and the mask pattern is focused on the surface of the wafer by a focusing optical system 44. The illuminating optical system 43 is so constructed that light emitted from a lamp 45 is passed through a condenser lens 46 to magnify a lamp image and then through an ultraviolet radiation cutting filter 47 and an infrared radiation cutting filter (cold mirror) 48 to be once converged on a slit 50 following a lens 49. Further, light having passed through the slit 50 is focused as slit light on the mask 41 by a lens 51, plane mirror 52, concave mirror 53 and lens 54, and it scans the mask 41 with the movement of this mask. Meanwhile, the focusing optical system 44 is so constructed that the mask pattern can be focused on the surface of the wafer 42 by plane mirrors 55, 56, 57, a concave mirror 58 and a convex mirror 59. A power source unit for the lamp 45 has a power supply 60, a control portion 61 which includes a sliding voltage regulator or an SCR (Silicon Controlled Rectifier) for varying and controlling the supply voltage of the power supply 60 within a range not higher than a fixed voltage (200 V), and a transformer 62 which receives the output voltage of the control portion 61 as its primary voltage and boosts it to its secondary voltage of high voltage.

On the other hand, a luminosity control unit 63 has luminosity monitoring sensors 22 disposed at positions closely proximate to the mask 41, so as to apply the luminosity detection signals of the sensors to a microcomputer 65. The luminosity monitoring sensors 22 may be ones as shown in FIG. 2. In the microcomputer 65, the detection signal is processed into a set value by a processor 66, and the set value is applied to one input terminal of a comparator 68. The other input terminal of the comparator 68 is supplied with the primary voltage delivered from the control portion 61. Besides, using the output of the comparator 68, the degree of voltage variation of the control portion 61 is controlled to change the primary and secondary voltages, whereby the luminosity of the lamp 45, namely, the quantity of light can be changed.

Further, in FIG. 6, numeral 71 designates a base, numeral 72 a strut, numeral 73 an air spring, numeral 74 a granite surface table, and numeral 75 a wafer focusing unit having leveling pads 76. Shown at numeral 77 is a servomotor which is a driving motor for moving a scan table 79 by the use of a metal belt 78, and which is additionally provided with a tachometer generator 80. Numeral 81 indicates a loader/unloader for the wafer, and numeral 82 a custody portion which has the custody of a large number of cartridges for receiving the wafers.

In the projection aligner of the present embodiment, as described before, the plurality of luminosity monitoring sensors 22 as illustrated in plan in FIG. 2 are disposed and fixed arcuately so as to conform to the shape of the slit. The respective sensors 22 are connected, not only to the processor 66, but also to luminosity detection means 23 in the luminosity control unit 63. The luminosity detection means 23 compares the output values of the respective sensors 22 with one another and with a predetermined reference value. There is disposed compensation means for automatically compensating the luminosity distribution on the basis of outputs from the luminosity detection means 23 capable of finding the luminosity distribution. That is, light shield devices 26 as shown in FIGS. 4 and 5 are disposed within the illuminating portion 43, and they are driven by a control unit 27 which operates on the basis of the outputs of the luminosity detection means 23, whereby the luminosity distribution can be compensated.

According to the above construction, the illuminating optical system 43 composed of the condenser lens 46, slit 50, concave mirror 53 etc. focuses the slit image of the light of the lamp 45 on the mask 41, to form the mask pattern as a new light source. The focusing optical system 44 focuses the mask pattern image on the wafer 42 by means of the mirrors 55, 56, 57, 58 and 59, to project the mask pattern on the wafer for the exposure to the light. At this time, each of the luminosity monitoring sensors 22 detects the luminosity at the position just this side of the mask 41, and the detected value is processed by the processor 66 into the set value, which is inputted to the comparator 68. Simultaneously, the primary voltage outputted from the control portion 61 is inputted to the comparator 68. Each time the signals from the luminosity monitoring sensors 22 are applied to the luminosity control unit 63, in other words, at each of the intermittent operations of scanning the mask 41 by the lamp light, the optimum set value is determined, and the degree of voltage variation of the control portion 61 is controlled in accordance with such intermittently-variable set value. Thus, the primary and secondary voltages are properly varied and controlled, and the luminosity of the lamp 45 is feedback-controlled so that the intensity of illumination at the mask 41 may be held constant.

Furthermore, according to the construction of the above embodiment of the present invention, when the luminosity detection means 23 has detected nonuniformity in the luminosity on the basis of the outputs of the luminosity sensors 22, it informs the control unit 27 of a higher luminosity part or lower luminosity part in the slit light. In response thereto, the control unit 27 selectively drives the light shield device which corresponds to the slit light part requiring the compensation. More specifically, the light shield device at the higher luminosity part rotates the micrometer head rightwards by means of the pulse motor, thereby to move up the fore end of the micrometer head and to rock the arm upwards. Thus, the light shield plate unitary with the arm increases in the amount of advance into the light beam, to reduce the quantity of light of the corresponding part and to partially lower the luminosity. On the other hand, regarding the lower luminosity part, by rotating the pulse motor leftwards, the light shield plate is moved down and the amount of advance thereof into the light beam is reduced, to increase the quantity of light of the corresponding part and to partially raise the luminosity. Accordingly, a uniform luminosity is automatically attained by controlling the respective light shield devices independently of one another.

Accordingly, in accordance with the present invention, the light having passed through the optical elements such as lenses greatly influential on luminosity fluctuations is detected for monitoring, and the ensuing light is projected on the wafer by the mirrors less influential on the luminosity fluctuations, so that a luminosity value scarcely differing from the luminosity on the wafer can be detected as the monitoring luminosity, whereby the luminosity fluctuations on the wafer can be rendered very small. Moreover, in the present embodiment, the monitoring sensors are disposed at the positions where the slit light of the lamp being the light source is focused, so that the luminosity for the total quantity of light of the lamp can be detected, and the accuracy of the control can be enhanced more.

Furthermore, in the present embodiment, the primary voltage of the power source portion unit is utilized for detecting the light quantity control signal of the lamp light. Therefore, the structure of the whole apparatus is simplified, and the comparison and the control can be performed at all times. It is also possible to intermittently perform only the alteration of the set value. Accordingly, the embodiment is applicable to projection aligners in various aspects.

Here, the signal on the lamp side may be the secondary power unlike the primary voltage exemplified before, but the primary voltage of low voltage is easier of handling.

Furthermore, according to the projection aligner of the present invention, the sensors to be inserted and located in the optical path at each exposure of the photo-mask are disposed for detecting the luminosity distribution, and when the distribution has become nonuniform, an alarm is issued, or the nonuniformity is automatically compensated. Therefore, the luminosity distribution is always held uniform, and a nonconforming article attributed to the nonuniform luminosity is prevented from arising. This brings forth the effect that enhancement in the available percentage can be achieved.

In addition, the present invention is applicable, not only to the 1:1 projection aligner, but also to a 10:1 reduction projection aligner, a 5:1 reduction projection aligner, etc.

As set forth above, the projection aligner of the present invention consists in that luminosity monitoring sensors are disposed in positions closely proximate to a mask, while the voltage of a power source unit is utilized for detecting the light quantity signal of a lamp, the detecting operation being intermittently performed. Therefore, luminosity fluctuations on a wafer are prevented to realize good exposure and to realize the fabrication of a wafer of high quality. Another effect is that the apparatus can be rendered simple in structure and low in cost.

What is claimed is:

1. A projection exposure method for transferring a pattern of a mask or reticle to a wafer to focus an image of the pattern of the mask or reticle onto the wafer, comprising the steps of:

exposing the wafer with an elongated strip-shaped exposure light of a light source means white focusing the image of the pattern of the mask or reticle on the wafer with the strip-shaped light of the light source means; and monitoring a quantity of the strip-shaped light of the light source means at a plurality of positions in or proximate to an optical path between the light source means and the wafer, so as to detect the distribution of the light in the elongated direction of the strip-shaped light at a position substantially corresponding to the mask, the reticle or the wafer.

2. A projection exposure method according to claim 1, wherein the step of monitoring includes detecting the quantity of the light which is to be incident on the wafer prior to the light being reflected from the wafer.

3. A projection exposure method according to claim 2, wherein the wafer is disposed at a remote position from the mask or reticle when exposed to the light.

4. A projection exposure method according to claim 1, wherein the step of monitoring includes utilizing a plurality of sensor means for detecting the quantity of light.

5. A projection exposure method according to claim 1, wherein the step of monitoring includes utilizing at least one sensor means displaceable in the elongated direction of the strip-shaped light so as to detect the quantity of the light at the plurality of positions.

6. A projection exposure method for transferring a pattern or a mask or reticle to focus an image of the pattern of the mask or reticle, on the wafer, comprising the steps of:

exposing the wafer to an elongated strip-shaped exposure light of a light source means transversing the wafer in a direction on a surface of the wafer being scanned in a direction substantially orthogonal to the transversing direction so as to expose the entire area of the surface of the wafer while focusing the image of the pattern of the mask or reticle on the wafer with the strip-shaped light of the light source means; and monitoring a quantity of the strip-shaped light at a plurality of positions in or proximate to an optical path between the light source means and the wafer so as to detect the distribution of the light in the elongated direction of the strip-shaped light at a position substantially corresponding to the mask, the reticle or the wafer.

7. A projection exposure method according to claim 6, wherein the step of monitoring includes detecting the quantity of the light which is to be incident on the wafer prior to the light being reflected from the wafer.

8. A projection exposure method according to claim 7, wherein the wafer is disposed at a remote position from the mask or reticle when being exposed to the light.

9. A projection exposure method according to claim 6, wherein the step of monitoring includes utilizing a plurality of sensor means for detecting the quantity of light.

10. A projection exposure method according to claim 8, further comprising the step of adjusting the quantity of the light corresponding to a plurality of positions in the strip-shaped exposure light on the basis of the light quantity detected during the step of monitoring.

11. A projection exposure method according to claim 10, wherein the step of adjusting includes controlling at least a portion of the width of an aperture defining the strip-shaped exposure light.

12. A projection exposure method according to claim 8, wherein the step of monitoring includes detecting the quantity of the light at a position at which an image is formed at the exposure of the wafer.

13. A projection exposure method according to claim 6, wherein the step of monitoring includes detecting the quantity of the light at a position at which an image is formed at the exposure of the wafer.

14. A projection exposure method for transferring a pattern of a mask or reticle to a wafer to focus an image of the pattern of the mask or reticle on the wafer, comprising the steps of:
    focusing the image of the pattern of the mask or reticle onto the wafer with an elongated strip-shaped light of a light source means to expose the wafer with the strip-shaped exposure light of the light source means while changing the optical path of the strip-shaped light relative to the wafer so that the optical path of the strip-shaped light incident on the wafer traverses the surface of the wafer to be exposed; and
    monitoring a quantity of the strip-shaped light at a plurality of positions in or proximate to an optical path of the strip-shaped light to be incident on the wafer between the light source means and the wafer, so as to detect the distribution of the light in the elongated direction of the strip-shaped light at a position substantially corresponding to the position of the mask, the reticle or the wafer.

15. A projection exposure method according to claim 14, wherein the step of monitoring includes detecting the quantity of the light prior to the light being reflected from the wafer.

16. A projection exposure method according to claim 15, wherein the wafer is disposed at a remote position from the mask when being exposed to the light.

17. A projection aligner according to claim 16, wherein the step of monitoring includes monitoring the quantity of the light during exposure of the wafer by utilizing at least one sensor means to detect the light.

18. A projection exposure method according to claim 16, further comprising the step of controlling an adjustment of the quantity of the light corresponding to a plurality of positions in the strip-shaped exposure light on the basis of the light detected.

19. A projection exposure method according to claim 18, wherein the step of controlling includes adjusting a portion of a width of an aperture defining the strip-shaped exposure light.

20. A projection exposure method according to claim 16, wherein the step of monitoring includes detecting the quantity of the light at a position at which an image is formed at the exposure of the wafer.

21. A projection exposure method according to claim 12, wherein the step of monitoring includes utilizing at least one sensor means displaceable in the elongated direction of the strip-shaped light so as to detect the quantity of the light at the plurality of positions.

22. A 1:1 projection exposure method for transferring a pattern of a mask or reticle onto the photoresist film coated on a wafer for manufacturing semiconductor devices comprising:
    exposing the wafer to an elongated strip-shaped exposure light of a light source means traversing the wafer in a direction on a surface of the wafer being scanned in a direction substantially orthogonal to the traversing direction so as to expose substantially the entire area of the surface of the wafer while focusing the image of the pattern of the mask or reticle onto the wafer with the strip-shaped light of the light source means; and
    monitoring a quantity of the strip-shaped light at a plurality of positions in or proximate to an optical path between the light source means and the wafer so as to detect the distribution of the light in the elongated direction of the strip-shaped light at a position substantially corresponding to the mask, the reticle or the wafer.

23. A 1:1 projection exposure method according to claim 22, wherein the step of monitoring includes detecting the quantity of the light which is to be incident on the wafer prior to the light being reflected from the wafer.

24. A 1:1 projection exposure method according to claim 23, wherein the wafer is disposed at a remote position from the mask or reticle when being exposed to the light.

25. A 1:1 projection exposure method according to claim 22, wherein the step of monitoring includes utilizing a plurality of sensor means for detecting the quantity of light.

26. A 1:1 projection exposure method according to claim 24, further comprising the step of adjusting the quantity of the light corresponding to a plurality of positions in the strip-shaped exposure light on the basis of the light quantity detected during the step of monitoring.

27. A 1:1 projection exposure method according to claim 26, wherein the step of adjusting includes controlling at least a portion of the width of an aperture defining the strip-shaped exposure light.

28. A 1:1 projection exposure method according to claim 26, wherein the step of monitoring includes detecting the quantity of the light at a position at which an image is formed at the exposure of the wafer.

29. A 1:1 projection exposure method according to claim 22, wherein the step of monitoring includes detecting the quantity of the light at a position at which an image is formed at the exposure of the wafer.

* * * * *